United States Patent [19]
Wells

[11] 4,237,546
[45] Dec. 2, 1980

[54] MULTI-LAYERED BACK PLANE FOR A COMPUTER SYSTEM

[75] Inventor: George H. Wells, Santa Ana, Calif.

[73] Assignee: Technology Marketing, Inc., Costa Mesa, Calif.

[21] Appl. No.: 7,933

[22] Filed: Jan. 31, 1979

[51] Int. Cl.³ .................................. H01R 23/68
[52] U.S. Cl. ..................... 364/900; 361/413
[58] Field of Search ... 364/200 MS File, 900 MS File; 361/413

[56] References Cited

U.S. PATENT DOCUMENTS 3,992,686  11/1976  Canning ............... 361/413
4,038,642  7/1977   Bouknecht et al. ......... 364/200

Primary Examiner—Raulfe B. Zache
Attorney, Agent, or Firm—Knobbe, Martens, Olson, Hubbard & Bear

[57] ABSTRACT

The multi-layered back plane of this invention permits a plurality of processors and a plurality of memories to be interleaved through separate memory interface boards in a computer in a manner which provides a significant reduction of path length while eliminating crossover of signal cables and permitting the use of identical memory interface boards, resulting in a significant increase in the clock rate and efficiency of the computer.

5 Claims, 4 Drawing Figures

MULTI-LAYERED BACK PLANE FOR A COMPUTER SYSTEM

BACKGROUND OF THE INVENTION

Back planes of the prior art are exemplified in U.S. patent application Ser. No. 714,925, filed by Arnold F. Christiansen, Donald E. MacDonald, and George H. Wells, on Aug. 16, 1976, and assigned to Technology Marketing Incorporated, the disclosure of which is incorporated herein by reference. Such back planes typically have two layers of parallel conductor buses and pins connecting finger connectors to those buses via conductor pads. The finger connectors connect to circuit boards mounted edgewise on the back plane. One goal in the art has been to find an efficient way of connecting a plurality of processor circuit boards through separate memory interface boards to separate memory circuit boards. Another goal in the art has been to decrease the signal path length in the computer in order to increase the clock speed of the computer. Yet another goal in the art has been to use identical components such as memory interface circuit boards to reduce costs. However, use of prior art back planes such as the type disclosed in the above-referenced patent application has prevented the reduction of signal path lengths when a plurality of memories and a plurality of processors are interleaved and has prevented the use of identical memory interface circuit boards when the signal path lengths are minimized. Thus, the prior art has taught that there is no way to avoid an increase in path length with the addition of more memories and processors to be interleaved using back planes of the prior art. Furthermore, the prior art has taught that crossover of signal paths, which is well known to be undesirable in the art, cannot be avoided if identical memory interface circuit boards are used, thereby increasing the cost of interconnecting a plurality of processors and memories.

SUMMARY OF THE INVENTION

The multi-layered back plane of this invention results in a decrease in path length when a plurality of memories and processors are interleaved. Furthermore, the multi-layered back plane of this invention eliminates the crossover of signal paths while allowing the use of identical memory interface boards, thereby minimizing the cost of interleaving the plurality of memories and circuit boards.

The multi-layered back plane of this invention comprises a plurality of back planes superimposed, each back plane connectably accessible by circuit boards mounted on the front or the back face of the multi-layered back plane. Each of the planes has two layers of parallel conductor buses. Finger connectors for connecting circuit boards edgewise are provided on both front and back faces of the multi-layered back plane. The finger connectors are selectively connected to the conductor buses through pins extending perpendicularly through all layers of the multi-layered back plane. However, none of the pins intersects any of the conductor buses. Instead, the pins are selectively connected to the conductor buses by means of conductive pads extending from the conductor buses, each pad lying in the same plane with its associated conductor bus. The pads are selectively located to be intersected by a particular pin. Thus, an important feature of the invention is that the conductor pad locations may be selected to permit a connection of a particular finger connector which may be disposed on either the front or the back face of the multi-layered back plane to a particular conductor bus in any layer of the multi-layered back plane.

Thus, the invention provides a multi-layered back plane having independent circuits within the plane, each circuit accessible from either face of the multi-layered back plane.

In a particular embodiment, a front and a back memory, each comprising a group of circuit boards, are mounted on the front and back faces of a multi-layered back plane, respectively. A front and a back processor are similarly mounted on a second multi-layered back plane. An additional pair of processors may be mounted on a third multi-layered back plane.

Interconnection between the front and back memories on the first multi-layered back plane and the front and back processors on the second and third multi-layered back planes may be accomplished by the means of ribbon cables which are connected between memory interface circuit boards. Use of these memory interface circuit boards, in combination with this unique back plane, prevents crossover of ribbon cables because a memory interface circuit board mounted on a face of the multi-layered back plane may be connected to circuit boards mounted on either face of the same multi-layered back plane. Thus, it is seen that crossover of the ribbon cable is completely eliminated because a memory interface circuit board mounted on either face of a multi-layered back plane may be connected to either the front memory or the back memory.

The signal path length is reduced significantly because each multi-layered back plane, which has substantially the same surface area as prior art back planes, mounts two memories or two processors while eliminating cable crossover by providing connection between some front and back circuit boards.

DETAILED DESCRIPTION

Prior Art

Figure 1:
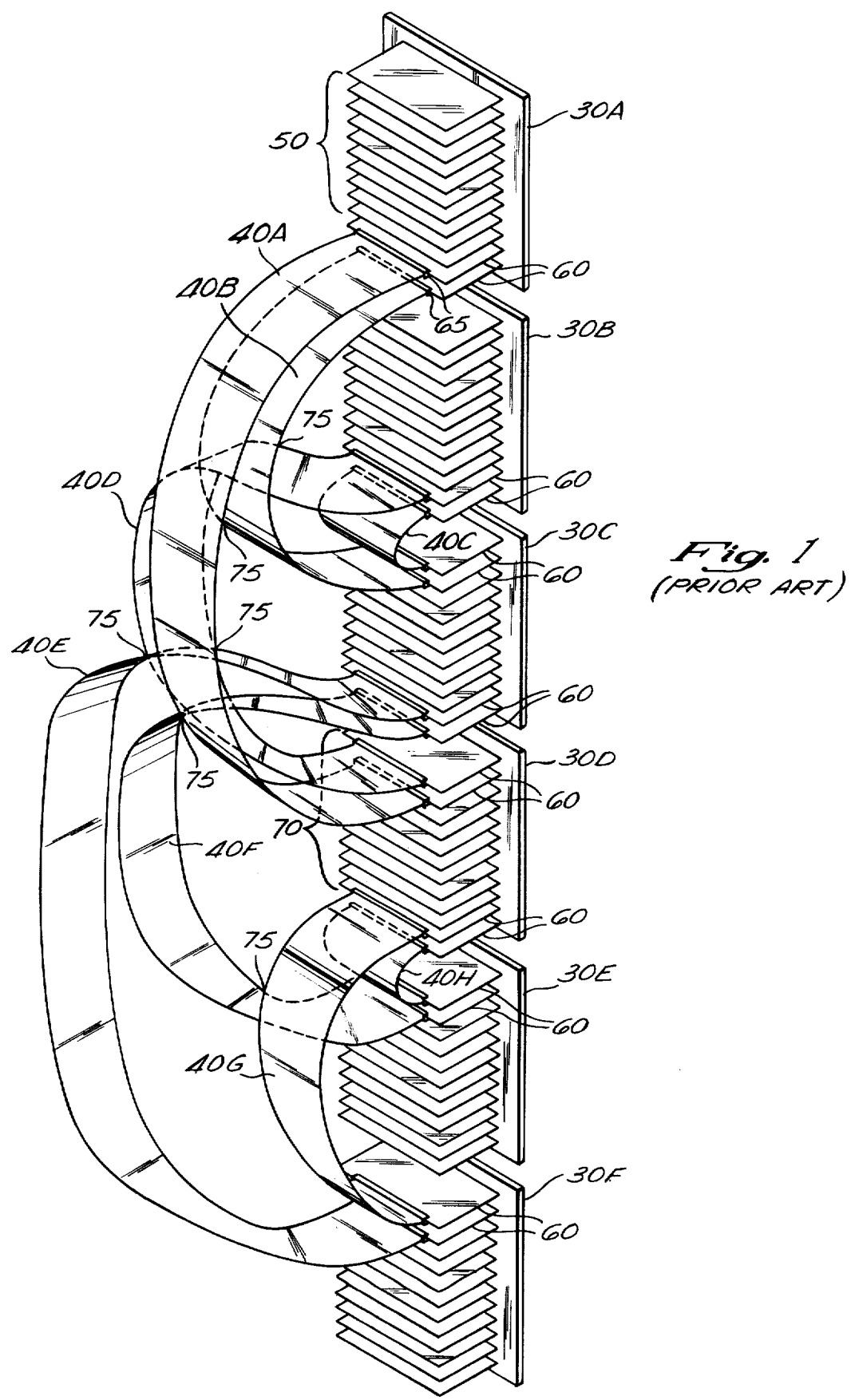
FIG. 1 is a perspective view of the interconnection of four processors with two memories using back planes of the prior art, clearly showing the long signal paths and the crossover of ribbon cables.

The problems of long signal path lengths and crossover of cables encountered in interleaving a plurality of processors with a plurality of memories using back planes of the prior art are illustrated in FIG. 1. A processor consisting of a plurality of processor circuit boards 50 is mounted on each back plane 30A, 30B, 30E, and 30F. A memory consisting of a plurality of memory circuit boards 70 is mounted on each back plane 30C and 30D. Each of the back planes 30A through 30F is a prior art back plane, such as the type disclosed in the Christiansen patent, which mounts a plurality of circuit boards in planes orthogonal to the back planes.

The interconnection between the processor circuit boards 50 and the memory circuit boards 70 is made by means of ribbon cables 40A through 40H crossing over one another at points 75 to connect between memory interface circuit boards 60 connected on each of the back planes 30A through 30F. Each of the memory interface circuit boards 60 is provided with cable connectors 65 which permit the ribbon cable 40A through 40H to connect between the various back planes 30A through 30F.

Each processor back plane 30A, 30B, 30E, 30F is separately connected to each memory back plane 30C, 30D through individual memory interface circuit boards 60 to provide for electrical isolation among processors and memories.

It is apparent in FIG. 1 that these connections may only be made by forcing the ribbon cables 40A through 40H to cross over one another at crossover points 75 and by forming the long signal path extending all the way from back plane 30A at the top of FIG. 1 to back plane 30F at the bottom of FIG. 1. The signal path length is in direct proportion to the number of processors and memories interleaved, and inversely related to the maximum speed of the computer. These long path lengths thus result in a substantial degredation computer performance.

Figure 2:
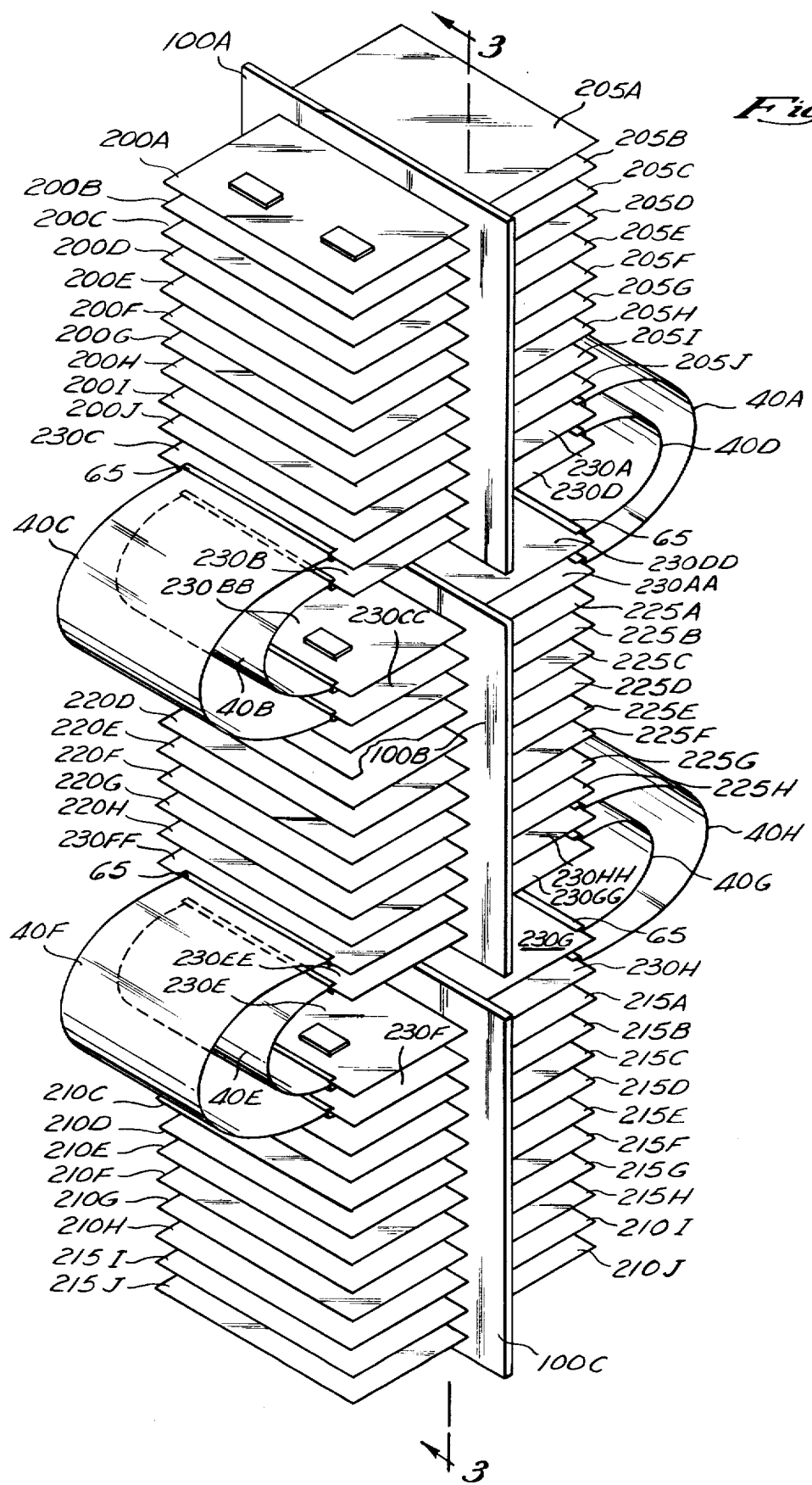
FIG. 2 is a perspective view of the preferred embodiment of this invention in which three multi-layered back planes of this invention are used to interleave four processors with two memories.

Interleaving Four Processors With Two Memories By the Multi-Layered Back Plane of This Invention FIG. 2 illustrates a preferred embodiment in which three multi-layered back planes of this invention may be used to interleave four processors with two memories. Multi-layered back planes 100A, 100B, and 100C are placed end-to-end in a coplanar array. A front processor 200 comprises processor circuit boards 200A through 200J mounted orthogonally on the front face of the multi-layered back plane 100A and a back processor 205 comprises processor circuit boards 205A through 205J mounted orthogonally on the back face of the multi-layered back plane 100A. A second front processor 210 comprises processor circuit boards 210A through 210J mounted on the front face of multi-layered back plane 100C and a second back processor 215 comprises processor circuit boards 215A through 215J mounted on the back face of the multi-layered back plane 100C. A front memory 220 comprises memory circuit boards 220A through 220H mounted on the front face of multi-layered back plane 100B, and a back memory 225 comprises memory circuit boards 225A through 225H mounted on the back face of the multi-layered back plane 100B.

It is desirable to interconnect each processor 200, 205, 210, and 215 with each memory 220 and 225. Connection between memories and processors mounted on opposite sides of the common plane of the back planes 100 is accomplished by means of ribbon cables connected between memory interface circuit boards without any crossover of the ribbon cables. For example, the front processor 200 is connected to the back memory 225 via the ribbon cable 40A. One end of ribbon cable 40A is connected to the back memory interface board 230AA which is mounted on the back of the multi-layered back plane 100B and connected to the back memory 225. The other end of ribbon cable 40A is connected to the back memory interface board 230A which, although mounted on the back of the multi-layered back plane 100A, is connected to the front processor 200. Connection between memories and processors mounted on the same sides is similarly made. For example, back processor 205 is connected to the back memory 225 via ribbon cable 40D between back memory interface boards 230D and 230DD mounted on the back faces of multi-layered back planes 100A and 100B, respectively. From these examples, it is seen that the back memory 225 on the multi-layered back plane 100B is connected to both the front processor 200 and the back processor 205 by means of two ribbon cables 40A and 40D without any crossover of the ribbon cables 40A and 40D and without requiring any of the ribbon cables to extend the length of any multi-layered back plane. FIG. 2 shows that all of the ribbon cables 40A through 40H are connected between adjacent or nearly adjacent memory interface boards 230A through 230H and 230AA through 230HH. Comparing FIG. 2 with the prior art interconnection shown in FIG. 1, it is seen that each prior art back plane mounts only one processor or memory and not two. In FIG. 1, the ribbon cables 40E and 40A must extend the length of at least two of the back planes 30B and 30C. Thus, comparing the signal path lengths required by the back planes of the prior art 30A through 30F in FIG. 1 with the shorter signal path lengths provided by the multi-layered back planes 100A, 100D, and 100C of this invention, it is seen that this invention results in a significant reduction in the signal path length between interconnected processors and memories and elimination of the crossover at points 75 of the cables.

Memory Interface Circuit Boards

This invention reduces signal path lengths and eliminates crossover of cables by providing circuit elements mounted on each multi-layered back plane which connect memory interface circuit boards mounted on one face to other circuit boards mounted on either the front or back face of the multi-layered back plane. These circuit elements are discussed in the next sub-title of this specification. The memory interface boards 230A through 230H and 230AA through 230HH may be identical, and must provide a connection between the ribbon cables 40A through 40H and the multi-layered back plane. For this purpose, each memory interface board has a ribbon cable connector 65 mounted on its outer edge, as illustrated in FIG. 2. It should be recognized that each of the memory interface boards may also have logic elements which control the addressing of and transfer of data with a particular memory by a particular processor.

Crossover Elements Within Each Layer of the Multi-Layered Back Plane

Figure 3:
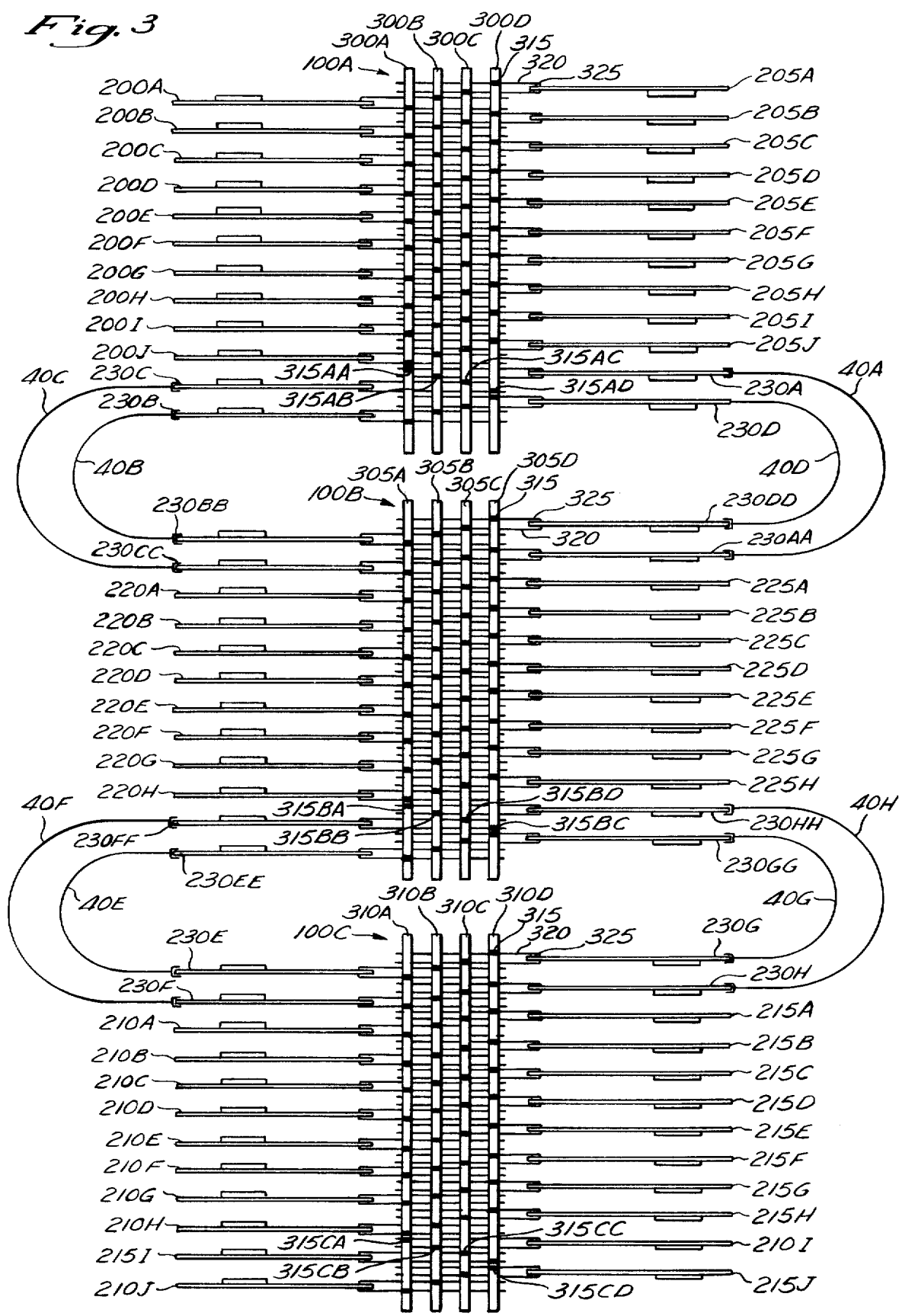
FIG. 3 is a cross-sectional view of FIG. 2 taken along lines 3—3 of FIG. 2.

FIG. 3 is a cross-sectional view of the three multi-layered back planes of FIG. 2 taken along lines 3—3 of FIG. 2. FIG. 3 shows that each of the multi-layered back planes 100A, 100B, and 100C is comprised of four layers of a plurality of insulated parallel co-planar conductor buses. For example, the cross-sectional view in FIG. 3 of the multi-layered back plane 100A shows four conductor buses 300A, 300B, 300C, 300D in four different layers of the multi-layered back plane 100A. Although FIG. 3 shows only one conductor bus 300 in each of the four layers, additional conductor buses having the same structure are present in each of the layers and are aligned directly behind the buses 300A, B, C, D and therefore are not visible in the view of FIG. 3. Each of the buses 300A, 300B, 300C, 300D has a plurality of extending conductor pads 315, each intersected by one of a plurality of perpendicular pins 320. The pins 320 pass completely through the multi-layered back plane 100A and are connected in pairs to finger connectors 325. The finger connectors 325 mount the plurality of circuit boards comprising the front processor 200 and the back processor 205. The pins 320 are located so as not to intersect or connect to any of the conductor buses 300A, 300B, 300C, 300D. Connection is made only at the pads 315 extending from the conductor buses 300A, 300B, 300C, 300D, which are selectively located so as to be intersected by certain ones of the pins 320. This feature will be described below in a later subtitle of this specification.

The conductor buses 300A, 300B may be considered as front conductor buses, while the conductor buses 300C, 300D may be considered back conductor buses.

FIG. 3 shows that the location of the pads 315 forms a repetitive periodic pattern beginning at the top and extending to the bottom of the multi-layered back plane 100A. Finger connectors 325 are connected to alternating pairs of the pins 320 on each face of the back plane 100A in order to permit mutual interconnection of circuit boards mounted on the same side of the plane 100A. Mutual connection of front circuit boards is made through front buses 300A, 300B while mutual connection of back circuit boards is made through rear buses 300C, 300D, exclusively. Inspection of FIG. 3 shows that the front processor boards 200A through 200J are all connected to the front conductor buses 300A, 300B by selectively located pads 315 intersected by pins 320. Similarly, the back processor boards 205A through 205J are connected to the back conductor buses 300C, 300D by other selectively located pads 315 intersected by other pins 320. Likewise, on back plane 100B, front memory boards 220A-H are mutually connected via front conductor buses 305A, 305B and back memory boards 205A-H are mutually connected via back conductor buses 305C, 305D. The processor boards mounted on back plane 100C are mutually connected as on back plane 100A, except that the memory interface boards 230E-H are mounted at the top instead of the bottom of the back plane 100C, because of the bottom location of back plane 100C, requiring some processor boards to be mounted at the bottom of the back plane 100C.

FIG. 3 shows that the pattern of pad locations repeats at every four pads, but is reversed, in back plane 100A for example, at the four pads 315AA, AB, AC, AD, connected to interface boards 230A and 230C, so that each of the memory interface boards 230A and 230C may be mounted on one side of the plane 100A but connected to circuit boards mounted on the opposite side of the back plane 100A. Thus, back memory interface board 230A is connected to front conductor buses 300A, 300B while front memory interface board 230C is connected to back conductor buses 300C and 300D. The pad location pattern resumes, however, so that memory interface boards 230D and 230B are connected to circuit boards mounted on the same side of the back plane 100A. Thus, it is seen that it is the location of the pads 315 and not any structural or electrical differences between memory interface boards which determines whether a memory interface board is to connect to circuit boards mounted on the same side or the opposite side of the back plane.

Inspection of the location of the pads 315 in the multi-layered back planes 100B, 100C shows that the location of the pads 315 in multi-layered back planes 100B, 100C is identical to the location of the pads 315 in multi-layered back plane 100A. Thus, all three back planes 100A, 100B, 100C may be of identical structure and are interchangeable. Each of the back planes, 100A, B, and C, has four of its pads, 315AA-AD, 315BA-BD, and 315CA-CD, respectively, disposed in a location pattern reversed from the periodic location pattern of the remaining pads 315, as discussed above in connection with back plane 100A, for connecting some of the memory interface circuit boards to circuit boards on the opposite side of the back plane. However, the pads 315CA-CD in back plane 100C having a reversed location pattern are connected to processor boards 210I and 215I, instead of memory interface boards, because the bottom location of back plane 100C requires memory interface boards to be mounted at the top of back plane 100C. As a result, the front processor board 210I must be mounted on the back and the back processor board 215I must be mounted on the front of back plane 100C, as shown in FIG. 3.

For purposes of this description, memory interface boards 230A, 230C, 230FF, and 230HH which are connected to circuit boards mounted on the opposite face of the back plane by virtue of their connection to pairs of the pads 315AA-AD, 315BA-BD having reversed pad location patterns shall be referred to as "reversing" memory interface boards. The term "reversing" merely refers to the connection of these interface boards with pairs of the pads 315AA-AD, 315BA-BD having reversed pad location patterns, but does not refer to any differences between memory interface boards. As discussed above, it is the location of the pads 315 and not any structural or electrical differences between memory interface boards which determines whether a memory interface board is to connect to circuit boards mounted on the same side or the opposite side of the back plane. Thus, it is seen that identical memory interface boards may be used so that all memory interface boards are interchangeable. For example, memory interface boards 230A and 230D are interchangeable while the location pattern of the pads 315 is reversed between memory interface boards 230A and 230D.

The use of identical memory interface boards 230A through 230H to interleave the processors 200, 205, 210, 215 with the memories 220, 225 using the multi-layered back planes 100A, 100B, 100C of this invention requires that front memory interface boards 230C, 230B, 230BB, 230CC, 230FF, 230EE, 230E, 230F be mounted with their components "up" as shown in FIG. 3, while back memory interface boards 230A, 230D, 230DD, 230AA, 230HH, 230GG, 230G, 230H are mounted with their circuit board components "down" as shown in FIG. 3. Preferably, every front and back circuit board is mounted with components "up" and "down", respectively, including memory boards and processor boards, so that identical boards can be used on the front and back. It will be recognized that this requires the reversal of the location pattern of some of the pads 315 discussed above.

Connection of the Ribbon Cables

Connections are made between various processors and memories by means of ribbon cables 40A through 40H connected between memory interface boards on different multi-layered back planes in such a manner that the cables never cross over one another nor cross over to an opposite side of the back plane assembly. In general, the front processors are connected to front memories via ribbon cables connected between front memory interface boards. Back processors are connected to back memories via ribbon cables connected between back memory interface boards. Front processors are connected to back memories via ribbon cables connected either between a front memory interface board and a reversing front memory interface board, or between a back memory interface board and a reversing back memory interface board. Connection between front memories and back processors are made in the same manner. As an example of the reversing type of connection, front processor 200 is connected to back memory 225 via ribbon cable 40A connected between reversing back memory interface board 230A mounted on multi-layered back plane 100A and back memory interface board 230AA mounted on multi-layered back plane 100B. Thus, whenever a front processor 200 or 210 is connected to a back memory 225, or whenever a back processor 205, 215 is connected to a front memory 220, it is seen that a reversing memory interface board must be used for each individual connection. It should also be noted that whenever a front processor 200, 210 is connected to a front memory 220 or whenever a back processor 205, 215 is connected to a back memory 225, no reversing memory interface board need be used.

Ribbon cables 40A through 40D constitute all of the connections between multi-layered back planes 100A and 100B. Ribbon cables 40E through 40H constitute all of the connections between multi-layered back planes 100B and 100C.

As a consequence of the location of the pads 315 shown in FIG. 3 throughout the multi-layered back planes 100A, 100B, 100C, ribbon cable 40A connects between front processor 200 and back memory 225 via reversing memory interface board 230A and memory interface board 230AA, ribbon cable 40B connects between front processor 200 and front memory 220 via memory interface boards 230B and 230BB, ribbon cable 40C connects between back processor 205 and front memory 220 via reversing memory interface board 230C and memory interface board 230CC while ribbon cable 40D connects between back processor 205 and back memory 225 via memory interface boards 230D and 230DD. Likewise, ribbon cable 40E connects between front memory 220 and front processor 210 via memory interface boards 230E and 230EE, ribbon cable 40F connects between back memory 225 and front processor 210 via reversing memory interface board 230FF and memory interface board 230F, ribbon cable 40G connects between back memory 225 and back processor 215 via memory interface boards 230GG and 230G, and ribbon cable 40H connects between front memory 220 and rear processor 215 via reversing memory interface board 230HH and memory interface board 230H.

Connections Between Conductor Buses and Circuit Boards

Figure 4:
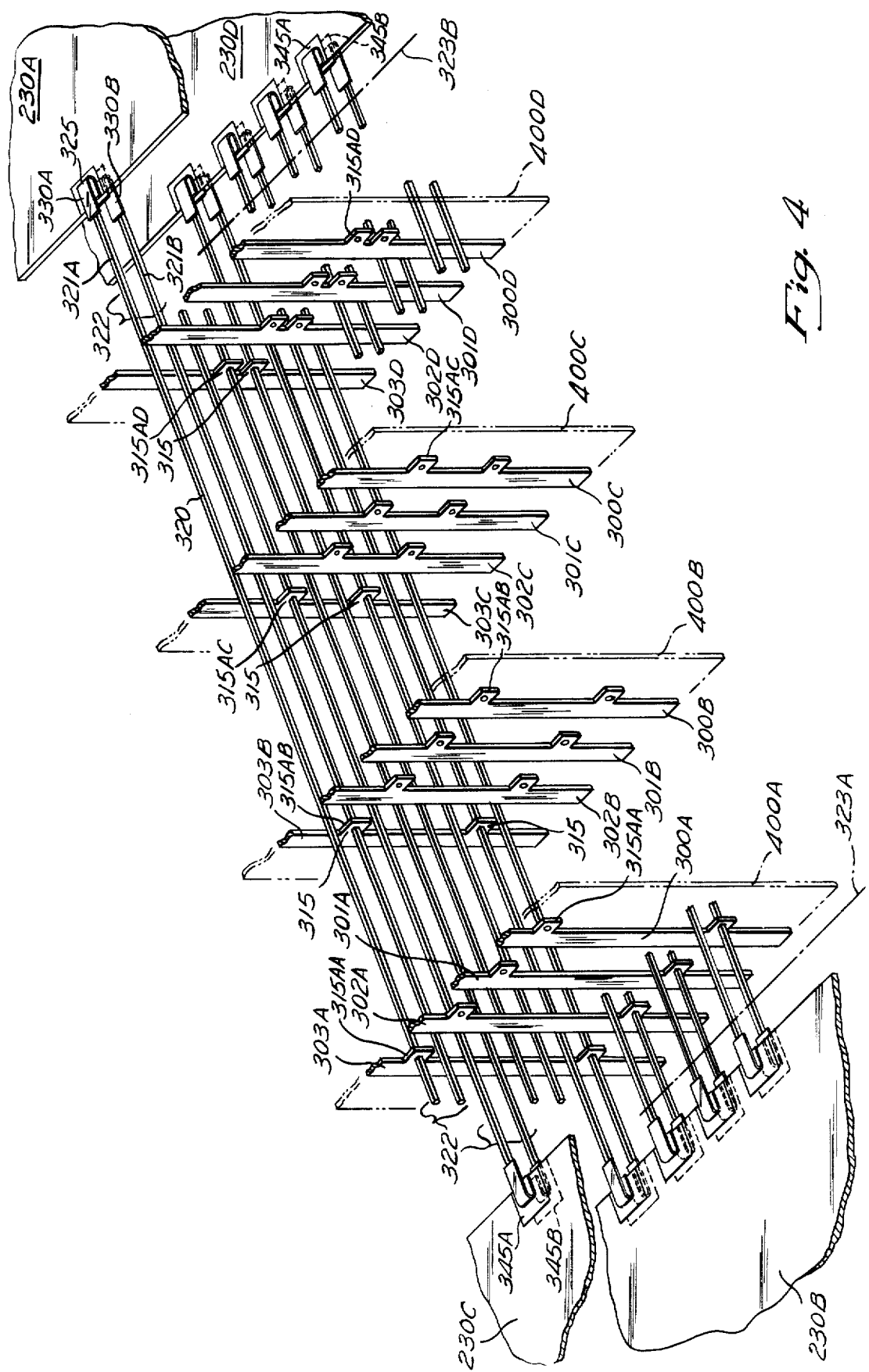
FIG. 4 is an exploded perspective view of one of the back planes of FIG. 3.

FIG. 4 is an exploded perspective view of a portion of the multi-layered back plane 100A of FIGS. 2 and 3 in which the length of the pins 320 is exaggerated for purposes of illustration. FIG. 4 shows the connection of only the four memory interface boards 230A-D to back plane 100A. Although FIG. 4 illustrates only a portion of back plane 100A, the structure shown in FIG. 4 may be considered typically of all three back planes 100A, B, C. FIG. 4 shows that the multi-layered back plane 100A is comprised of four insulating printed circuit board planes 400A, 400B, 400C, 400D, providing the four layers of a plurality of insulated and mutually parallel conductor buses which were described above in connectin with FIG. 3. The outer plane 400A defines the front of the multi-layered back plane 100A, and the outer plane 400D defines the back. Printed circuit board plane 400A has conductor buses 300A, 301A, 302A, 303A, and other conductor buses not shown in FIG. 4. Likewise, printed circuit board plane 400B has conductor buses 300B, 301B, 302B, 303B, and other conductor buses not shown in FIG. 4. In similar fashion, the printed circuit board planes 400C and 400D have conductor buses 300C-303C and 300D-303D, respectively, and additional buses not shown. The plurality of conductor buses shown in FIG. 4 in each printed circuit board plane 400A, B, C, D are connected to the circuit boards in the same manner as the individual buses 300A, B, C, D shown in FIG. 3. Thus, for example, processor boards 200A-J shown in FIG. 3 are mutually connected not only by conductor buses 300A, B, as previously discussed in connection with FIG. 3, but also by conducting buses 301A, 302A, 303A, and 301B, 302B, 303B, shown in FIG. 4 in the planes 400A and 400B, respectively. Inspection of FIG. 4 shows that the conductor buses in each layer 400 have identical structures. Thus, the structure and the location of pads 315 is identical on all conductor buses 300A, 301A, 302A, 303A in the plane 400A. The same is true of conductor buses located in the other planes 400B, C, D.

FIG. 4 shows a plurality of pins 320 passing through all four printed circuit board planes 400A, 400B, 400C, 400D. It may be seen in FIG. 4 that the pins 320 pass adjacent to the conductor buses 300-303 but do not intersect the buses. The pins 320, however, do intersect pads 315 at selected locations. Each of the pads 315 is selectively connected to a particular one of the conductor buses, and extends away from that conductor bus to be intersected by one of the pins 320. Selective placement of the plurality of pads 315 assures a unique connection between a particular pin 320 and a particular one of the conductor buses.

The plurality of pins 320 are grouped into pin pairs 322. The pin pairs 322 are arranged in rows 323 which are parallel to each of the printed circuit boards 400, and are perpendicular to the conductor buses 300-303. Each of the pins 320 has end portions 321 protruding from the outer printed circuit board planes 400A, 400D. A pair of the end portions 321A, 321B of the pins 320 in each pin pair 322 mounts a pair of finger springs 330A, B forming one female finger connector 325 for each pin pair. FIG. 4 shows that each of the circuit boards 230A through 230D has a plurality of male finger pads 345A, 345B on the top and bottom surfaces, respectively, of the board adjacent its edge facing the multi-layered back plane 100A. Each male finger pad 345A, 345B makes a wiping connection with a female finger spring 330A, 330B, respectively, as the boards are inserted. This arrangement is typical of all circuit boards mounted on the multi-layered back plane 100 of this invention.

Each circuit board is mounted in a particular row 323 of pin pairs 322 with female finger spring connectors 325. It should be noted that finger connectors 325 are provided in alternating rows 323A, 323B only on the front and back faces, respectively, of the back plane 100A, and that the rows 323A of finger connectors 325 on the front face of the plane 100A are staggered with respect to rows 323B on the back face. Therefore, each row 323 of pin pairs 322 has a plurality of finger connectors 325 on one face only of the back plane 100A mounting one circuit board.

Thus, it is seen that front circuit boards, namely circuit boards mounted in the front rows 323A of connectors 325, and back circuit boards, namely those circuit boards mounted on the back rows 323B of connectors 325, may be selectively connected to any one of the conductor buses in any of the planes 400A, 400B, 400C, or 400D by a proper selection of the location of the pads 315. As a result, back circuit boards may be selectively connected to front circuit boards. For example, the pads 315AA through AD illustrated in FIG. 4 make connection between the front processor boards 205A through 205J shown in FIG. 3 and reversing back memory interface board 230A via conductor buses 300A-303A and 300B-303B in the planes 400A and 400B, respectively.

The staggered alternating rows 323A, B of the connectors 325, provided on both faces of the three back planes 100A, B, C, in combination with the repetitive periodic location pattern of the plurality of pads 315, permit circuit boards to be mounted in each of the staggered rows 323A, 323B of the connectors 325 on both faces of the back planes 100A, B, C, as shown in FIG. 2. Also, the repetitive periodic location of pattern of the pads 315 permit mutual interconnection of front memory boards 220 with the front processor boards 200 and 210, and permit mutual interconnection of the back memory boards 225 with the back processor boards 205 and 215. The reversal of the location pattern of some of the pads including pads 315AA-AD shown in FIG. 4, in combination with the staggered alternating rows 323A, 323B of connectors 235, permits the connection between front memory boards 220 and back processor boards 205 and 215, and permits the connection between back memory boards 225 and front processor boards 200 and 210. Furthermore, each of the cables 40 is connected exclusively on the same side of the common plane of the back planes 100A, B, C, and do not cross over other cables 40 nor to the opposite side of the common plane, as shown in FIG. 2. FIG. 2 clearly shows the simplified connections formed by the four ribbon cables 40 afforded by the staggered rows 323A, 323B of connectors 325 combined with the normal and reversed periodic location pattern of pads 315 for separately connecting each memory board 210, 215 to each processor board 200, 205, 220, 225 through separate memory interface boards.

In FIG. 2, it is seen that each of the cables 40 connect only between memory interface boards 230 which are mounted on the same side, either front or back, of the common plane of the back plane 100A, B, C, and none of the cables 40 are connected between the front and back sides of this plane. In this way, the interleaving of the plurality of memories and processors shown in FIG. 2 is accomplished without any crossover of cables 40, which is necessary when using prior art back planes, as illustrated in FIG. 1. If the prior art back planes 30 of FIG. 1 were substituted for the multi-layered back planes 100A, B, C of FIG. 2 in the interleaved system illustrated in FIG. 2, in which each of the cables 40 are connected on a single side of the common plane only, it would not be possible to interleave all of the memories with all of the processors. In order to interleave all the memories with all the processors using prior art back planes, at least some of the cables 40 would have to be connected between opposite sides of the common plane in order that front memories may be connected to back processors and back memories may be connected to front processors.

In the interleaved system of FIG. 2, it is unnecessary to cross over any of the cables 40 in order to connect between components mounted on opposite sides of the common plane of the back planes 100A, B, C, since the location pattern of some of the pads 315 in each multi-layered back plane 100A, B, C, of this invention is "reversed" and these "reversed" pads, when connected to memory interface boards, provide electrical circuits which permit the data signal paths to cross over from one side of the common plane to the other side of the common plane in order to connect between components mounted on opposite sides of the common plane, thereby eliminating the need for any of the cables 40 to connect between opposite sides of the plane or to cross over one another. Thus, it is the reversal of the location pattern of some of the pads in each of the multi-layered back planes 100A, B, C, of this invention, and the connection of memory interface boards to these pads which causes the cables 40, connected exclusively on one side of the common plane, to interleave between not only a plurality of memories and processors mounted on the same side of the common plane, but also to interleave between memories and processors mounted on different sides of the common plane. Without this feature, the interleaved system of FIG. 2 would not interleave all of the memories, 200, 225 with all the processors 200, 205, 210, 215. In the absence of the crossover signal paths provided by the reversed location patterns of some of the paths 315 in each of the multilayered back planes 100A, B, C, the interleaving of all of the components in the system of FIG. 2 could only be accomplished by crossing cables over one another and between opposite sides of the common plane.

Thus, it is seen that the multi-layered back plane 100A permits the connection of separate components on opposite faces of the plane 100A and, when used in conjunction with a plurality of other identical multi-layered back planes, permits interleaving a plurality of different components such as processors and memories without any crossover of cable paths while at the same time significantly reducing the signal path lengths between the processor and the memories. Because the invention permits the use of identical multi-layered back planes and the use of identical memory interface circuit boards, this invention results in significant cost savings. At the same time, use of this invention in a computer allows the clock rate of the computer to be significantly increased because the use of the multi-layered back plane of this invention reduces the signal path length significantly.

While FIGS. 3 and 4 disclose only four layers within a single multi-layered back plane, it should be recognized that this invention includes similar multi-layered back planes which have more than four layers of conductor buses. For example, other conducting layers may be introduced between the layers 400A, 400B, 400C, 400D to provide a voltage plane or a ground plane, or additional signal planes. Thus, this invention includes multi-layered back planes with any number of layers interleaving any number of components such as memories and processors with minimized path lengths hitherto unattainable in the prior art, without any crossover of cables.

I claim:

1. A computer system having a plurality of circuit board components such as processors or memories mounted on a plurality of pairs of back planes, each of said back plane pairs comprising a front back plane having front and back faces, and a rear back plane having front and back faces, the back face of said front back plane facing the front face of said rear back plane, in which:
- one of said back plane pairs comprises a processor back plane pair having a first front face and a first back face; and
- another of said back plane pairs comprises a memory back plane pair having a second front face and a second back face, said system further comprising:
- front and back processor circuit board components mounted on said first front and back faces, respectively, said front processor components insulated from said back processor components;
- front and back memory circuit board components mounted on said second front and back faces, respectively, said front memory components insulated from said back memory components;
- first means in one of said processor and memory back plane pairs for providing electrical access on the front face of said one back plane pair to front and back components mounted on the front and back faces, respectively, of said one back plane pair while maintaining the front components of said one back plane pair insulated from its back components;
- second means in said one back plane pair for providing electrical access on the back face of said one back plane pair to said front and back components of said one back plane pair and maintaining said front components of said one back plane pair insulated from its back components; and
- plural connecting means, some of which are connected between said first means and the front face of the other of said back plane pairs, others of which are connected between said second means and the back face of said other back plane pair, said connecting means for connecting each of said front and back processor components to each of said front and back memory components.

2. A computer system as defined in claim 1 wherein said connecting means comprises a plurality of ribbon cables.

3. A computer system as defined in claim 1 wherein said processor and memory components comprise circuit boards mounted on said processor and memory back plane pairs, respectively.

4. A computer system as defined in claim 1 wherein said back plane pairs each comprises a pair of printed circuit boards, each board having front and back faces, said boards mutually parallel, the back face of one of said pair of printed circuit boards adjacent the front face of the other.

5. A computer system as defined in claim 1 further comprising a second processor back plane pair connected by said connecting means to said memory back plane pair.

* * * * *